(12) United States Patent
Nishimura et al.

(10) Patent No.: US 12,389,751 B2
(45) Date of Patent: Aug. 12, 2025

(54) DISPLAY DEVICE

(71) Applicant: Japan Display Inc., Tokyo (JP)

(72) Inventors: Masumi Nishimura, Tokyo (JP); Hayata Aoki, Tokyo (JP); Hiroumi Kinjo, Tokyo (JP)

(73) Assignee: Japan Display Inc., Tokyo (JP)

( * ) Notice: Subject to any disclaimer, the term of this patent is extended or adjusted under 35 U.S.C. 154(b) by 456 days.

(21) Appl. No.: 17/804,189

(22) Filed: May 26, 2022

(65) Prior Publication Data

US 2023/0010053 A1     Jan. 12, 2023

(30) Foreign Application Priority Data

Jun. 3, 2021 (JP) ................................. 2021-093677

(51) Int. Cl.
    *H10K 59/122*     (2023.01)
    *H10K 59/124*     (2023.01)
    *H10K 59/80*     (2023.01)

(52) U.S. Cl.
    CPC ......... *H10K 59/122* (2023.02); *H10K 59/124* (2023.02); *H10K 59/80521* (2023.02)

(58) Field of Classification Search
    CPC ............... H10K 59/122; H10K 59/124; H10K 59/80521; G09G 3/3208
    See application file for complete search history.

(56) References Cited

U.S. PATENT DOCUMENTS

| 2015/0207100 A1 | 7/2015 | Saito et al. |
| 2016/0079325 A1 | 3/2016 | Lee et al. |
| 2017/0133620 A1* | 5/2017 | Lee ......... H10K 71/00 |
| 2020/0168823 A1* | 5/2020 | Kim ......... H10K 59/122 |
| 2021/0066419 A1 | 3/2021 | Byun et al. |
| 2021/0066639 A1 | 3/2021 | Ko et al. |
| 2021/0135150 A1* | 5/2021 | Wang ......... H10K 71/00 |
| 2021/0151712 A1* | 5/2021 | Lee ......... H10K 50/824 |

FOREIGN PATENT DOCUMENTS

| JP | 2000-195677 A | 7/2000 |
| JP | 2008-135325 A | 6/2008 |
| JP | 2019169480 A | 10/2019 |

OTHER PUBLICATIONS

Office Action issued on Mar. 21, 2025, in corresponding Indian Application No. 202214030535, 6 pages.
Office Action issued on Mar. 27, 2025, in corresponding German Application No. 10 2022 205 528.4, 21 pages.

* cited by examiner

*Primary Examiner* — Matthew C Landau
*Assistant Examiner* — Dmitriy Yemelyanov
(74) *Attorney, Agent, or Firm* — Maier & Maier, PLLC

(57) ABSTRACT

In an embodiment, a display device comprises a substrate, display elements, a partition wall, a metal layer, and an inorganic layer. Each of the display elements comprises first and second electrode and an organic layer. The partition wall is between the display elements. The metal layer is along the partition wall. The inorganic layer covers the display elements, the partition wall, and the metal layer. The partition wall includes a first portion, and a second portion which is smaller in width than the first portion. The metal layer covers a first area on a side surface of the second portion. The inorganic layer covers a second area on the side surface. The second area is between the first area and the first portion.

16 Claims, 8 Drawing Sheets

DISPLAY DEVICE

CROSS-REFERENCE TO RELATED APPLICATIONS

This application is based upon and claims the benefit of priority from Japanese Patent Application No. 2021-093677, filed Jun. 3, 2021, the entire contents of which are incorporated herein by reference.

FIELD

Embodiments described herein relate generally to a display device.

BACKGROUND

Recently, display devices to which organic light-emitting diodes (OLEDs) as display elements are applied have been put into practical use. This display element comprises a first electrode, a second electrode, and an organic layer disposed between these electrodes. The organic layer includes an emitting layer which emits light in response to a voltage between the first electrode and the second electrode.

In general, the organic layer has a low resistance to moisture. If moisture reaches the organic layer for some reason, this can be a factor of causing degradation in display quality, such as a decrease in the luminance of a display element when emitting light.

DETAILED DESCRIPTION

Figure 1:
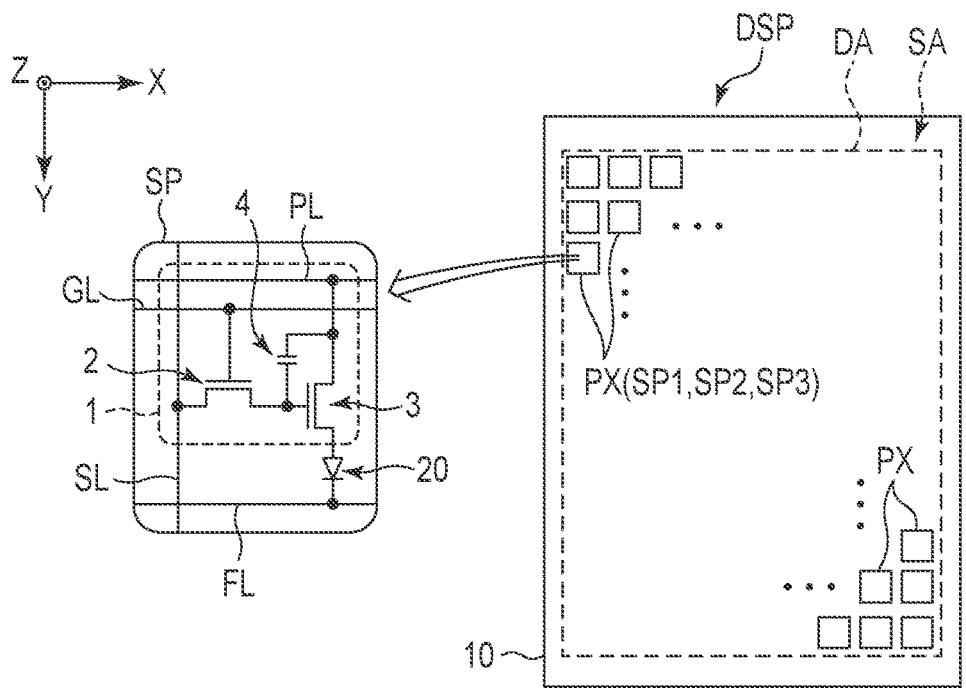
FIG. 1 is a view showing a configuration example of a display device according to one of embodiments.

In general, according to one embodiment, a display device comprises: a substrate; a plurality of display elements; a partition wall; a metal layer; and an inorganic layer. The display elements are disposed above the substrate, each of the display elements comprises a first electrode, a second electrode opposed to the first electrode, and an organic layer emitting light by applying a voltage between the first electrode and the second electrode. The partition wall is located between the display elements adjacent to each other. The metal layer is along the partition wall. The inorganic layer is formed of an inorganic material to cover the display elements, the partition wall, and the metal layer. The partition wall includes a first portion, and a second portion which is located below the first portion and which is smaller in width than the first portion. The metal layer covers a first area on a side surface of the second portion. The inorganic layer covers a second area on the side surface. The second area is located between the first area and the first portion.

According to this configuration, a display device capable of improving the display quality can be provided.

One of embodiments will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the figures, an X-axis, a Y-axis and a Z-axis orthogonal to each other are described to facilitate understanding as needed. A direction along the X-axis is referred to as a first direction, a direction along the Y-axis is referred to as a second direction, and a direction along the Z-axis is referred to as a third direction. A plane defined by the X-axis and the Y-axis is referred to as an X-Y plane, and a plane defined by the X-axis and Z-axis is referred to as an X-Z plane. Viewing the X-Y plane is referred to as planar viewing.

The display device of this embodiment is an organic electroluminescent display device comprising an organic light emitting diode (OLED) as a display element, and can be mounted on televisions, personal computers, vehicle-mounted devices, tablet terminals, smartphones, mobile phones, and the like.

FIG. 1 is a view showing a configuration example of a display device DSP according to the embodiment. The display device DSP has a display area DA where images are displayed and a peripheral area SA around the display area DA, on an insulating substrate 10. The substrate 10 may be glass or a flexible resin film.

In this embodiment, the shape of the substrate 10 in planar view is a rectangular shape. However, the shape of the substrate 10 in planar view is not limited to a rectangle, but may be any other shape such as a square, a circle or an ellipse.

The display area DA includes a plurality of pixels PX arrayed in a matrix in the first direction X and the second direction Y. Each of the pixels PX comprises a plurality of sub-pixels SP. For example, the pixel PX comprises a red sub-pixel SP1, a green sub-pixel SP2, and a blue sub-pixel SP3. In addition to the sub-pixels of the above three colors, the pixel PX may comprise four or more sub-pixels including a sub-pixel of the other color such as white.

The sub-pixel SP comprises a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are, for example, switching elements constituted by thin-film transistors.

In the pixel switch 2, a gate electrode is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to the power line PL and the capacitor 4, and the other is connected to an anode of a display element 20. The display element 20 is an organic light-emitting diode (OLED) serving as a light emitting element. A cathode of the display element 20 is connected to the power supply line FL to which a common voltage is applied. The configuration of the pixel circuit 1 is not limited to the example shown in the figure.

Figure 2:
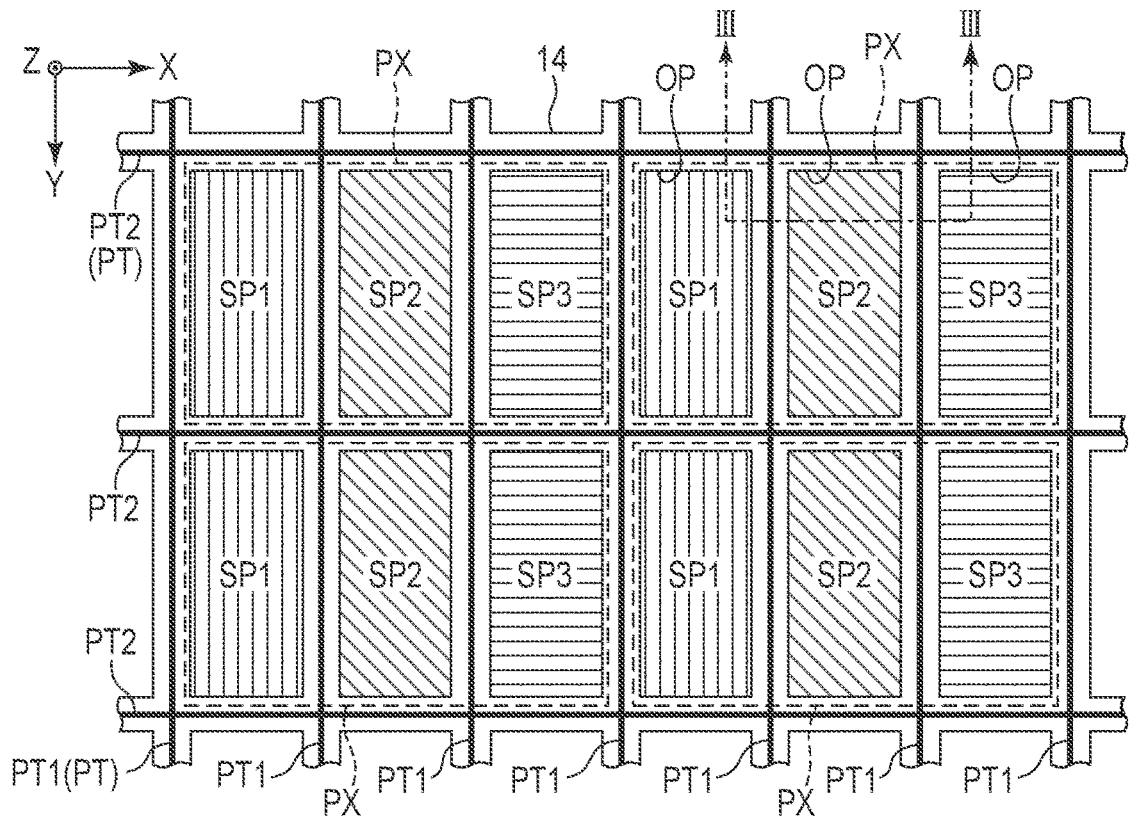
FIG. 2 is a view showing an example of a layout of sub-pixels according to the embodiment.

FIG. 2 is a figure which shows an example of a layout of sub-pixels SP (SP1, SP2, and SP3). Four pixels PX will be focused. In each of the pixels PX, the sub-pixels SP1, SP2, and SP3 are arranged in this order in the first direction X. In other words, a column constituted by a plurality of sub-pixels SP1 arranged in the second direction Y, a column constituted by a plurality of sub-pixels SP2 arranged in the second direction Y, and a column constituted by a plurality of sub-pixels SP3 arranged in the second direction Y are alternately disposed in the first direction X, in the display area DA.

A rib 14 is disposed at boundaries of the sub-pixels SP1, SP2, and SP3. In the example of FIG. 2, the rib 14 has a grating shape having parts located between the sub-pixels SP adjacent to each other in the first direction X and parts located between the sub-pixels SP adjacent to each other in the second direction Y. The rib 14 forms openings OP at the sub-pixels SP1, SP2, and SP3, respectively.

A plurality of partition walls PT are disposed on the rib 14. In the example of FIG. 2, the plurality of partition walls PT include a plurality of partition walls PT1 parallel to the second direction Y and a plurality of partition walls PT2 parallel to the first direction X. In other words, the plurality of partition walls PT are disposed in a grating shape.

The partition walls PT1 are located between the sub-pixels SP1 and SP2 adjacent to each other in the first direction X, between the sub-pixels SP2 and SP3 adjacent to each other in the first direction X, and between the sub-pixels SP1 and SP3 adjacent to each other in the first direction X, respectively. In other words, the partition walls PT1 are located at boundaries of the sub-pixels SP of different colors.

The partition walls PT2 are located between two sub-pixels SP1 adjacent to each other in the second direction Y, two sub-pixels SP2 adjacent to each other in the second direction Y, and two sub-pixels SP3 adjacent to each other in the second direction Y, respectively. In other words, the partition walls PT2 are located at boundaries of the sub-pixels SP of the same color. Since color mixture does not occur in the sub-pixels SP of the same color, the partition walls PT2 may be omitted.

Figure 3:
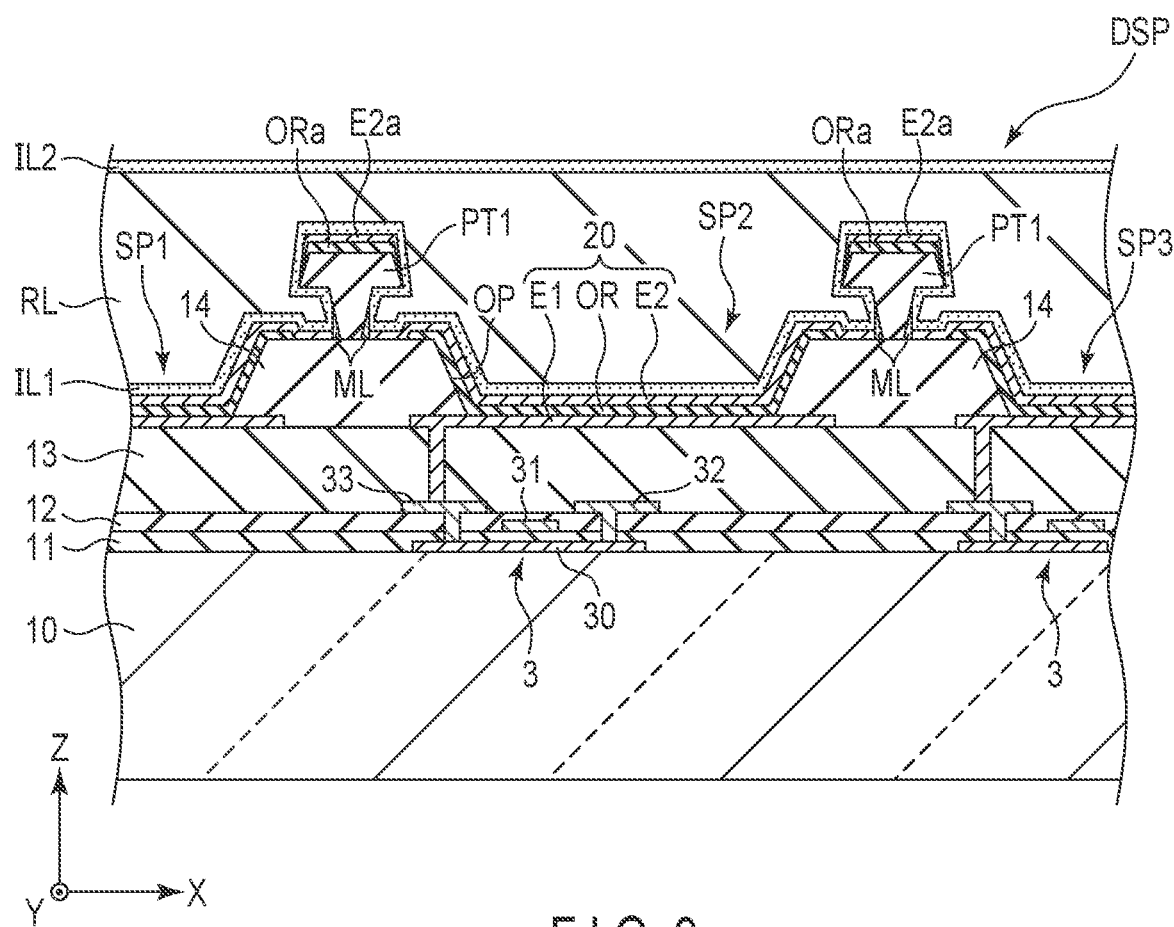
FIG. 3 is a schematic cross-sectional view showing the display device taken along line in FIG. 2.

FIG. 3 is a schematic cross-sectional view showing the display device DSP taken along line in FIG. 2. In FIG. 3, the cross-sectional structure of the sub-pixel SP2 is mainly shown, but the sub-pixels SP1 and SP3 also have the same cross-sectional structure. The drive transistor 3 and the display element 20 are shown as the elements disposed in the sub-pixel SP2, and illustration of the other elements is omitted.

The display device DSP comprises insulating layers 11, 12, and 13, a first inorganic layer IL1, a second inorganic layer IL2, a resin layer RL, and a metal layer ML in addition to the above-described substrate 10, rib 14, and partition walls PT1.

The insulating layers 11, 12, and 13 are stacked in the third direction Z on the substrate 10. The insulating layers 11 and 12 are formed of, for example, an inorganic material. For example, the insulating layer 13 is formed of an organic material.

The drive transistor 3 comprises a semiconductor layer 30 and electrodes 31, 32, and 33. The electrode 31 corresponds to the gate electrode. One of the electrodes 32 and 33 corresponds to the source electrode, and the other corresponds to the drain electrode. The semiconductor layer 30 is disposed between the substrate 10 and the insulating layer 11. The electrode 31 is disposed between the insulating layers 11 and 12. The electrodes 32 and 33 are disposed between the insulating layers 12 and 13, and are in contact with the semiconductor layer 30 through a contact hole that penetrates the insulating layers 11 and 12.

The display element 20 comprises a first electrode E1, a second electrode E2, and an organic layer OR disposed between the first electrode E1 and the second electrode E2. The first electrode E1 is an electrode disposed in each sub-pixel SP, and may be referred to as a pixel electrode, a lower electrode or an anode. The second electrode E2 may be referred to as a common electrode, an upper electrode or a cathode.

The rib 14 is disposed on the insulating layer 13. The rib 14 can be formed of an organic material. The first electrode E1 is disposed on the insulating layer 13 and overlaps with the opening OP. A periphery of the first electrode E1 is covered with the rib 14. The first electrode E1 is electrically connected to the electrode 33 through a contact hole which penetrates the insulating layer 13. The first electrode E1 is formed of a metal material. However, the first electrode E1 may be formed of a transparent conductive material such as an indium tin oxide (ITO) or an indium zinc oxide (IZO) or may be a stacked layer body of the transparent conductive material and a metal material.

An organic layer OR is in contact with the first electrode E1 through the opening OP. A part of the organic layer OR is located on the rib 14. The second electrode E2 covers the organic layer OR. The second electrode E2 is formed of, for example, a metal material. However, the second electrode E2 may be formed of a transparent conductive material such as ITO or IZO.

The partition walls PT1 are disposed on the rib 14. The partition walls PT2 shown in FIG. 2 are also disposed on the rib 14. The partition walls PT1 and PT2 are formed of an inorganic material in the present embodiment.

The metal layers ML are disposed near proximal parts of the partition walls PT1. In the example of FIG. 3, two metal layers ML are disposed on the rib 14, and the partition walls PT1 are located between these metal layers ML. Similarly, the metal layers ML are also disposed near the proximal parts of the partition walls PT2. The metal layers ML are formed of, for example, aluminum.

The first inorganic layer IL1 covers the second electrode E2, the partition walls PT1 and PT2, and the metal layer ML. The resin layer RL covers the first inorganic layer IL1. The resin layer RL is formed of, for example, the organic material (resin). The resin layer RL is thicker than the insulating layers 11, 12, and 13, the rib 14, the first inorganic layer IL1, the second inorganic layer IL2, the metal layers ML, and the partition walls PT1 and PT2, and flattens the unevenness caused by the rib 14 and the partition walls PT1 and PT2. The second inorganic layer IL2 covers the resin layer RL. The first inorganic layer IL1, the second inorganic layer IL2, and the resin layer RL function as sealing layers that protect the organic layer OR from moisture, and the like.

The partition walls PT1 and PT2, the first inorganic layer IL1, and the second inorganic layer IL2 are formed of, for example, an inorganic material such as silicon oxide (SiOx), silicon nitride (SiNx) or silicon oxynitride (SiONx). The partition walls PT1 and PT2 and the first inorganic layer IL1 are desirably formed of the same inorganic material from the viewpoint of adherence between them. Alternatively, both the partition walls PT1 and PT2 and the first inorganic layer IL1 may be formed of silicon-based inorganic materials, similarly to a case where, for example, either the partition walls PT1 and PT2 or the first inorganic layer IL1 is a silicon oxide and the other is a silicon nitride. Furthermore, the partition walls PT1 and PT2 and the first inorganic layer IL1 may be formed of inorganic materials of the same system other than silicon-based materials. Even in these cases, the adherence of the partition walls PT1 and PT2 and the first inorganic layer IL1 can be improved. The second inorganic layer IL2 may also be formed of the same inorganic material as the partition walls PT1 and PT2 and the first inorganic layer IL1 or may also be formed of the inorganic material of the same system as the partition walls PT1 and PT2 and the first inorganic layer IL1.

Figure 4:
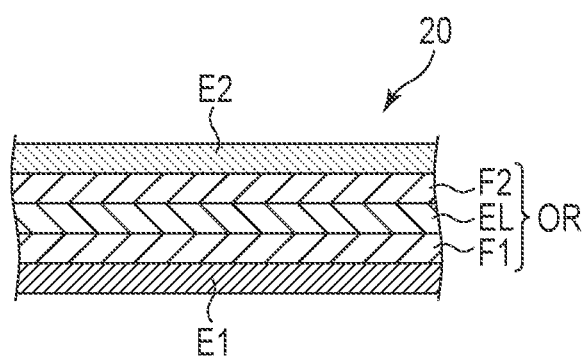
FIG. 4 is a cross-sectional view showing an example of a layer configuration applicable to an organic layer according to the embodiment.

FIG. 4 is a cross-sectional view showing an example of the layer configuration applicable to the organic layer OR. For example, the organic layer OR includes the first functional layer F1, the light-emitting layer EL, and the second functional layer F2 which are sequentially stacked from the first electrode E1 to the second electrode E2.

When the electric potential of the first electrode E1 is relatively higher than that of the second electrode E2, the first electrode E1 corresponds to the anode, and the second electrode E2 corresponds to the cathode. Alternatively, when the electric potential of the second electrode E2 is relatively higher than that of the first electrode E1, the second electrode E2 corresponds to the anode, and the first electrode E1 corresponds to the cathode.

For example, when the first electrode E1 corresponds to the anode, the first functional layer F1 includes at least one of a hole injection layer, a hole transport layer, and an electron blocking layer, and the second functional layer F2 includes at least one of an electron transport layer, an electron injection layer, and a hole blocking layer.

When a potential difference is formed of between the first electrode E1 and the second electrode E2, the emitting layer EL emits light. In this embodiment, it is assumed that the emitting layers EL included in the organic layers OR of the sub-pixels SP1, SP2, and SP3 all emit light of the same color (for example, white color). In this case, for example, a color filter corresponding to the color of the sub-pixels SP1, SP2, and SP3 may be disposed above the resin layer RL. Alternatively, a layer including the quantum dots which are excited by the light emitted from the emitting layers EL to generate light of the colors corresponding to the sub-pixels SP1, SP2, and SP3 may be disposed in the sub-pixels SP1, SP2, and SP3. The light-emitting layers EL of the sub-pixels SP1, SP2, and SP3 may emit the colors corresponding to the sub-pixels SP1, SP2, and SP3, respectively.

Figure 5:
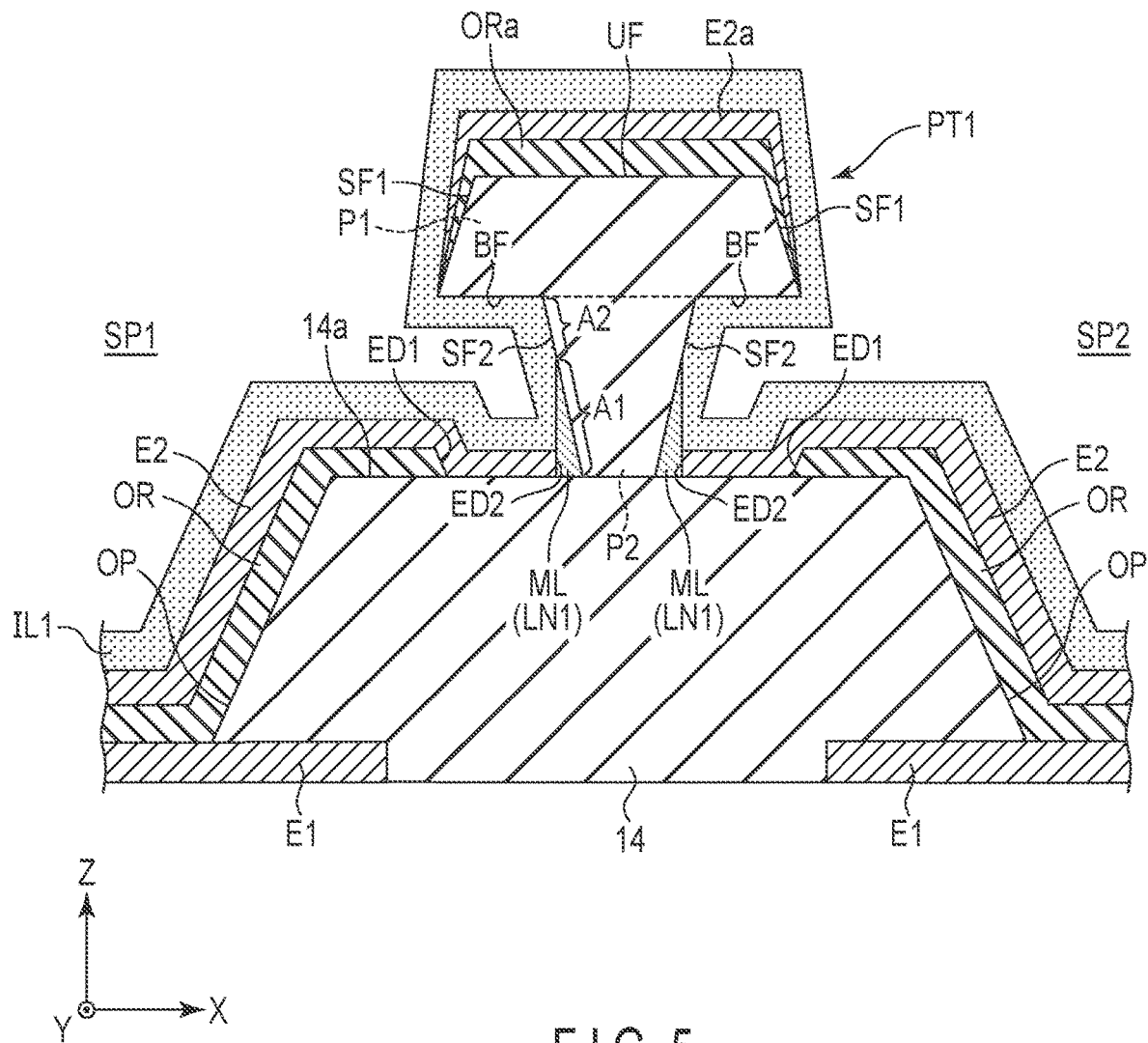
FIG. 5 is an enlarged cross-sectional view schematically showing a vicinity of the partition wall in FIG. 3.

FIG. 5 is an expanded sectional view schematically showing a vicinity of the partition wall PT1 located between the sub-pixels SP1 and SP2 in FIG. 3. The partition wall PT1 includes a first portion P1 and a second portion P2 that is smaller in width than the first portion P1. The second portion P2 is located below the first portion P1. The first portion P1 and the second portion P2 are integrally formed. In the example of FIG. 5, the second portion P2 is in contact with the upper surface 14a of the rib 14.

In the example of FIG. 5, a pair of side surfaces SF1 of the first portion P1 are inclined such that the distance between the side surfaces SF1 increases from an upper end to a lower end of the first portion P1. In other words, the width of the first portion P1 is not constant in the third direction Z. As another example, the pair of side surfaces SF1 may be parallel to the third direction Z. Alternatively, the pair of side surfaces SF1 may be inclined such that the distance between these side surfaces SF1 decreases from the upper end to the lower end of the first portion P1.

In the example of FIG. 5, the pair of side surfaces SF2 of the second portion P2 are inclined such that the distance between these side surfaces SF2 decreases from the upper end to the lower end of the second portion P2. In other words, the width of the second portion P2 is not constant in the third direction Z. As another example, the pair of side surfaces SF2 may be parallel to the third direction Z. Alternatively, the pair of side surfaces SF2 may be inclined so that the distance between these side surfaces SF2 increases from the upper end to the lower end of the second portion P2.

The first portion P1 has a pair of lower surfaces BF connecting the side surfaces SF1 and the side surfaces SF2. These lower surfaces BF are opposed to the upper surface 14a of the rib 14. The shape of the partition wall PT1 including the first portion P1 and the second portion P2 of such a shape can be called, for example, an overhang shape.

The metal layer ML covers parts of the side surfaces SF2. In other words, the side surface SF2 has a first area A1 covered with the metal layer ML and a second area A2 that is not covered with the metal layer ML. The second area A2 is located between the first area A1 and the first portion P1. In the example in FIG. 5, the first area A1 is larger than the second area A2.

In the example of FIG. 5, the width of the metal layer ML in the first direction X is smaller than the width (height) of the metal layer ML in the third direction Z. In addition, the width of the metal layer ML in the first direction X is smaller than the width of the lower surface BF in the first direction X. The metal layer ML is located below the first portion P1 as a whole. The lower end of the metal layer ML is in contact with the upper surface 14a. The upper end of the metal layer ML is located above the second electrode E2 on the rib 14. The shape of the metal layer ML is not limited to that exemplified here.

The upper surface UF of the partition wall PT1 (first portion P1) is covered with the organic layer ORa. In addition, the organic layer ORa is covered with a conductive layer E2a. In the example shown in FIG. 5, the organic layer ORa also covers the side surfaces SF1.

The organic layer ORa is formed of the same material as the organic layer OR. The conductive layer E2a is formed of the same material as the second electrode E2. The organic layer ORa is separated from the organic layers OR disposed in the sub-pixels SP1 and SP2. The conductive layer E2a is separated from the second electrodes E2 disposed in the sub-pixels SP1 and SP2.

The organic layer OR and the second electrode E2 are formed on an entire surface of the display area DA by, for example, vacuum deposition. At this time, materials from a deposition source are attached to the upper surface UF and the side surfaces SF1 of the partition wall PT1, and the organic layer ORa and the conductive layer E2a are thereby formed. In contrast, the materials from the deposition source are hardly attached to the lower surface BF and the side surfaces SF2. As a result, the organic layer OR and the organic layer ORa are separated, and the second electrode E2 and the conductive layer E2a are separated.

The organic layer OR has a first end portion ED1 located on the upper surface 14a of the rib 14. The second electrode E2 has a second end portion ED2 located on the upper surface 14a. The first end portion ED1 is covered with the second electrode E2. The second end portion ED2 is in contact with the metal layer ML.

The first inorganic layer IL1 continuously covers the second electrodes E2 of the sub-pixels SP1 and SP2, the metal layers ML which are formed on the pair of side surfaces SF2, respectively, the second area A2 of each of the pair of side surfaces SF2, the pair of lower surfaces BF, and the conductive layer E2a. In other words, the first inorganic layer IL1 is in contact with the second portion P2 in the second area A2.

In FIG. 5, the structure near the boundary of sub-pixels SP1 and SP2 is shown, but the same structure can be applied to the vicinity of the boundary of sub-pixels SP2 and SP3 and the vicinity of the boundary of sub-pixels SP1 and SP3. The same shape as that of the partition wall PT1 can be applied to the partition wall PT2 shown in FIG. 2. The structure shown in FIG. 5 can also be applied to the sectional structures near the boundary of two sub-pixels SP1 arranged in the second direction Y, the boundary of two sub-pixels SP2 arranged in the second direction Y, and the boundary of two sub-pixels SP3 arranged in the second direction Y.

Figure 6:
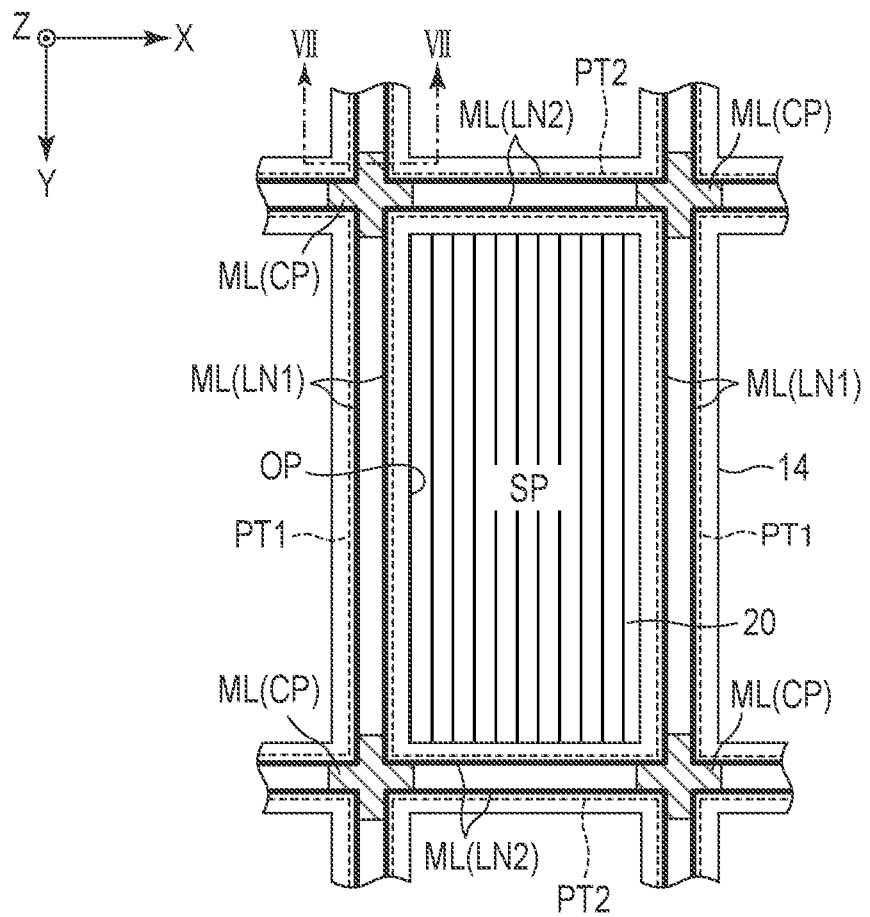
FIG. 6 is a schematic plan view showing an example of a shape of a metal layer according to the embodiment.

FIG. 6 is a schematic plan view showing an example of the shape of the metal layer ML. In FIG. 6, the outline of the first portion P1 of the partition walls PT1 and PT2 are represented by a broken line. The metal layer ML includes first linear portions LN1 extending in the second direction Y along the partition walls PT1, and second linear sections LN2 extending in the first direction X along the partition walls PT2. The metal layer ML shown in FIG. 3 and FIG. 5 corresponds to the first linear portion LN1.

In the example of FIG. 6, two first linear portions LN1 and two second linear portions LN2 that are close to the opening OP of the sub-pixel SP1 are connected in a rectangular shape. In other words, the metal layer ML surrounds the opening OP and the display element 20.

The metal layer ML includes a connection portion CP at an intersection of the partition walls PT1 and PT2 (intersection of rib 14). The connection portion CP connects the plurality of first linear portions LN1 with the plurality of second linear portions LN2. The plurality of first linear portions LN1 and the plurality of second linear portions LN2 surrounding the adjacent sub-pixels SP are thereby connected.

The metal layer ML of this configuration can be used as a power supply line FL shown in FIG. 2. In this case, the metal layer ML is connected to, for example, a line to which a common voltage is applied in the peripheral area SA. As shown in FIG. 5, in this embodiment, since the second electrode E2 and the metal layer ML are in contact with each other, the common voltage is applied to the second electrode E2 through the metal layer ML.

Figure 7:
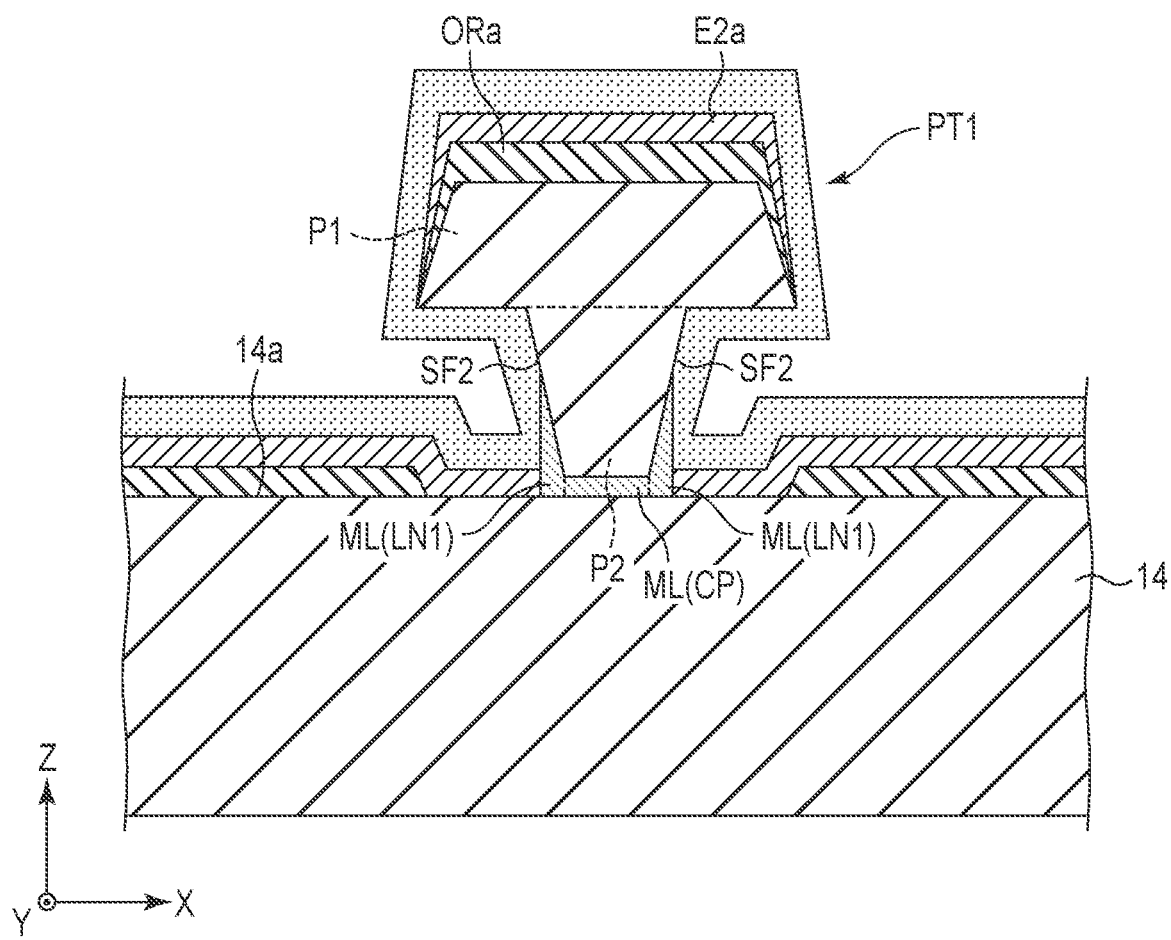
FIG. 7 is a schematic cross-sectional view showing the display device taken along line VII-VII in FIG. 6.

FIG. 7 is a schematic cross-sectional view showing the display device DSP taken along line VII-VII in FIG. 6. In this figure, the layers below the rib 14 and above the first inorganic layer IL1 are omitted.

The connection portion CP is located between the upper surface 14a of the rib 14 and the second portion P2 of the partition wall PT1. The connection portion CP is formed integrally with the first linear portions LN1 that are disposed on the pair of side surfaces SF2 of the second portion P2, respectively. In a section different from FIG. 7, the connection portion CP is also connected to the second linear portions LN2.

Next, an example of a method of manufacturing the display device DSP will be described.

Figure 8:
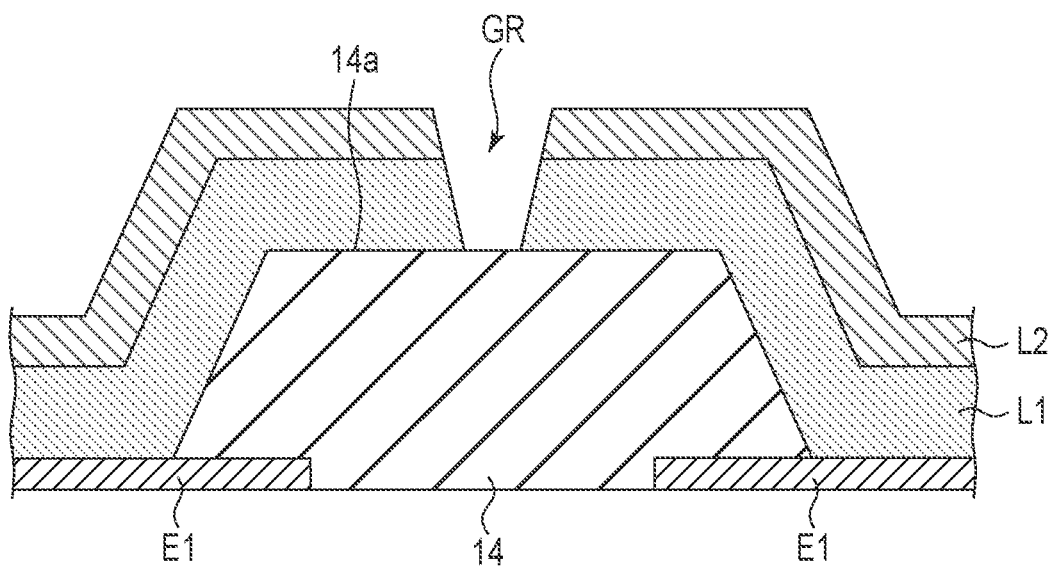
FIG. 8 is a view showing a manufacturing process for obtaining a partition wall and a metal layer according to the embodiment.

FIG. 8 to FIG. 12 are views showing the manufacturing processes for obtaining the partition wall PT and the metal layer ML. In FIG. 8, a first layer L1 which covers the rib 14 and the first electrodes E1, and a second layer L2 which covers the first layer L1 are formed.

The first layer L1 is formed of the same metal material as the metal layer ML. The second layer L2 is formed of a metal material that is less resistant to wet etching (higher in etching rate) than the first layer L1. For example, the first layer L1 can be formed of the aluminum and the second layer L2 can be formed of a molybdenum tungsten alloy.

A groove GR is provided in the first layer L1 and the second layer L2 above the rib 14. In planar view, the groove GR has the grating shape, similarly to the partition walls PT1 and PT2 shown in FIG. 2. In the cross section of FIG. 8, the groove GR penetrate to the upper surface 14a of the rib 14.

Figure 9:
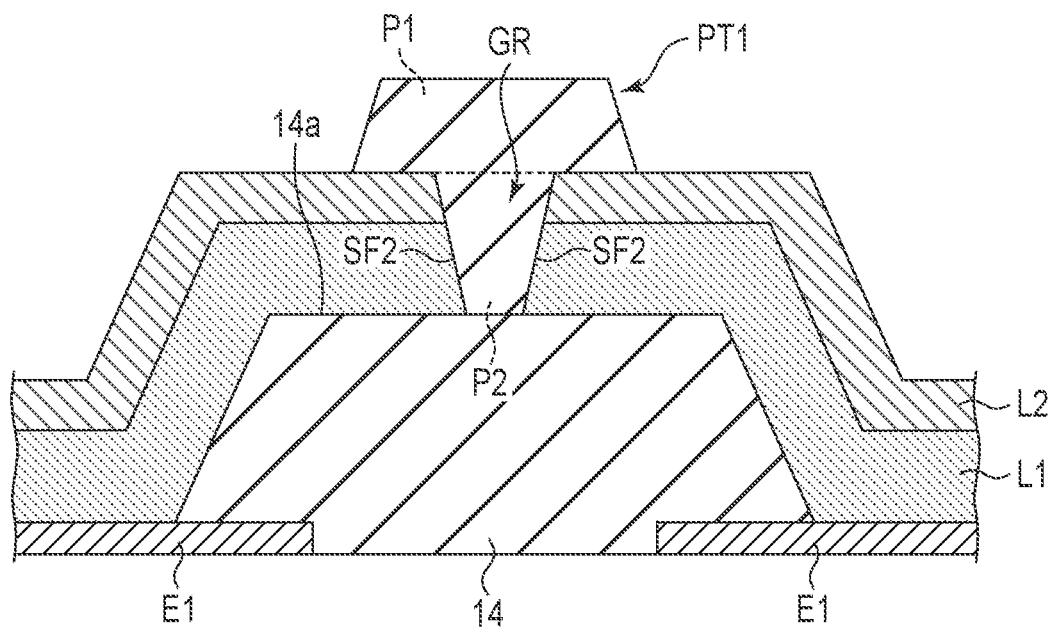
FIG. 9 is a view showing the manufacturing process following FIG. 8.

After the first layer L1 and the second layer L2 are formed, an inorganic layer serving as a base of the partition walls PT1 and PT2 is formed on the second layer L2. The inorganic layer fills the groove GR. The partition wall PT1 is obtained as shown in FIG. 9, by patterning the inorganic layer. The first portion P1 corresponds to a portion of the patterned inorganic layer, which is located outside the groove GR. The second portion P2 corresponds to a portion of the patterned inorganic layer, which is located inside the groove GR. The partition wall PT2 is also formed by the patterning.

After the partition walls PT1 and PT2 are formed, wet etching is performed to remove the first layer L1 and the second layer L2. The second layer L2 is entirely removed since its resistance to wet etching is weak, and the side surfaces SF2 of the second portion P2 that are in contact with the second layer L2 in the groove GR is exposed.

Figure 10:
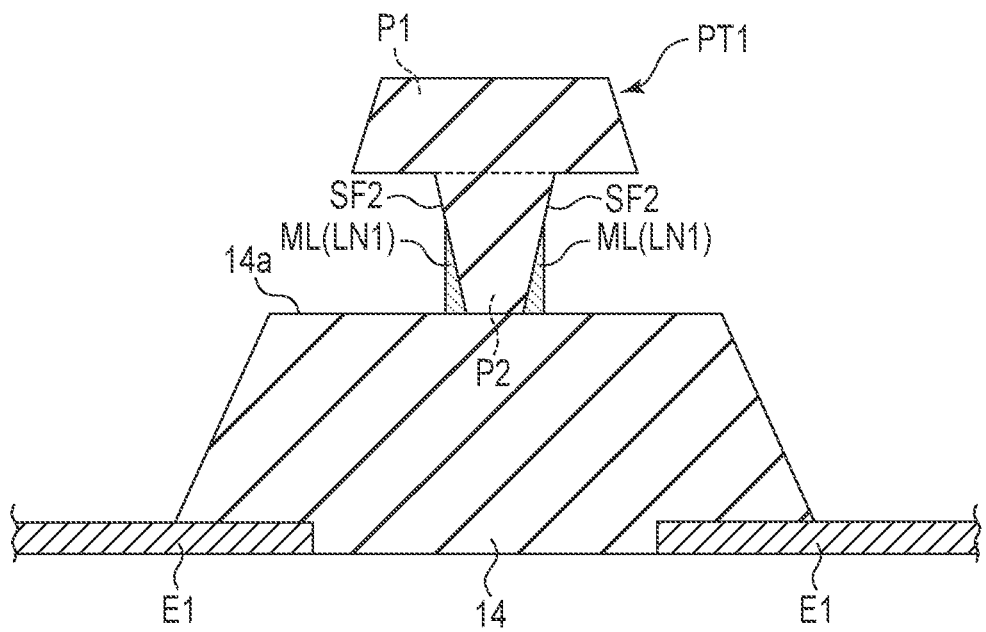
FIG. 10 is a view showing the manufacturing process following FIG. 9.

In contrast, the first layer L1 is not completely removed, but at least parts that are in contact with the side surfaces SF2 remain as shown in FIG. 10. The remaining parts correspond to the first linear portions LN1 of the metal layer ML. The second linear portions LN2 of the metal layer ML are formed by wet etching, too, in the same manner, in the vicinity of the partition wall PT2.

Figure 11:
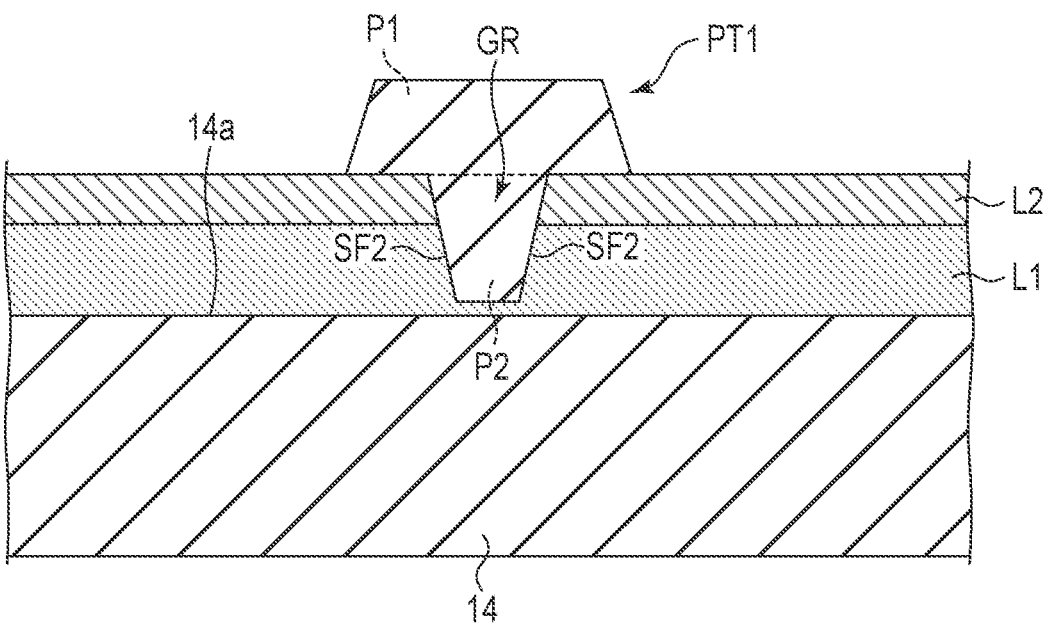
FIG. 11 is a view showing the manufacturing process for obtaining a connection part according to the embodiment.
Figure 12:
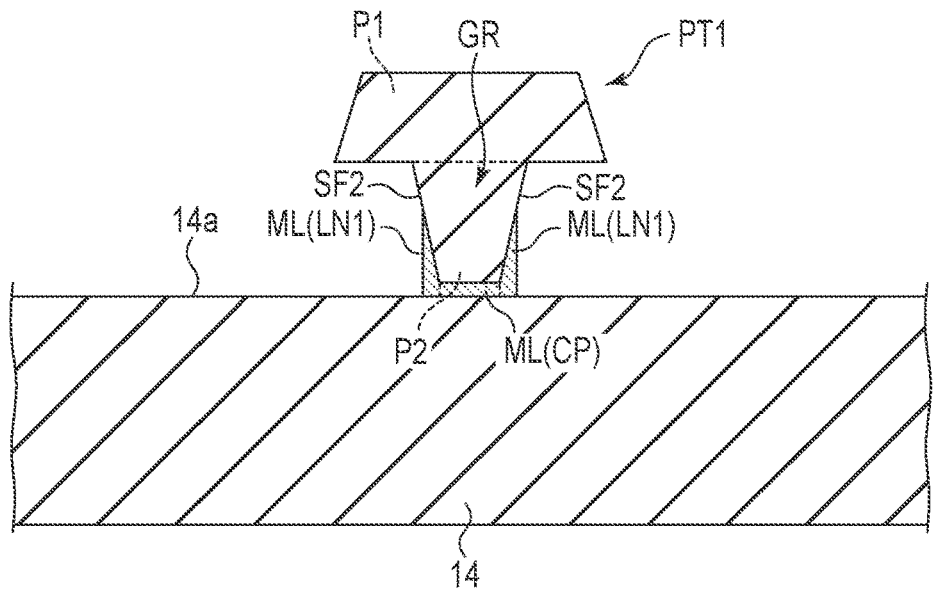
FIG. 12 is a view showing the manufacturing process following FIG. 11.

The groove GR is formed so as not to penetrate the first layer L1 as shown in FIG. 11, at the position of the metal layer ML where the connection portion CP is provided. When the partition walls PT1 and PT2 are formed for this groove GR, the first layer L1 is interposed between the second portion P2 and the upper surface 14a of the rib 14. When wet etching is performed for the first layer L1 and the second layer L2, the connection portion CP is formed below the second portion P2 as shown in FIG. 12.

Subsequently, an example of the advantage to be achieved by the present embodiment will be described.

Figure 13:
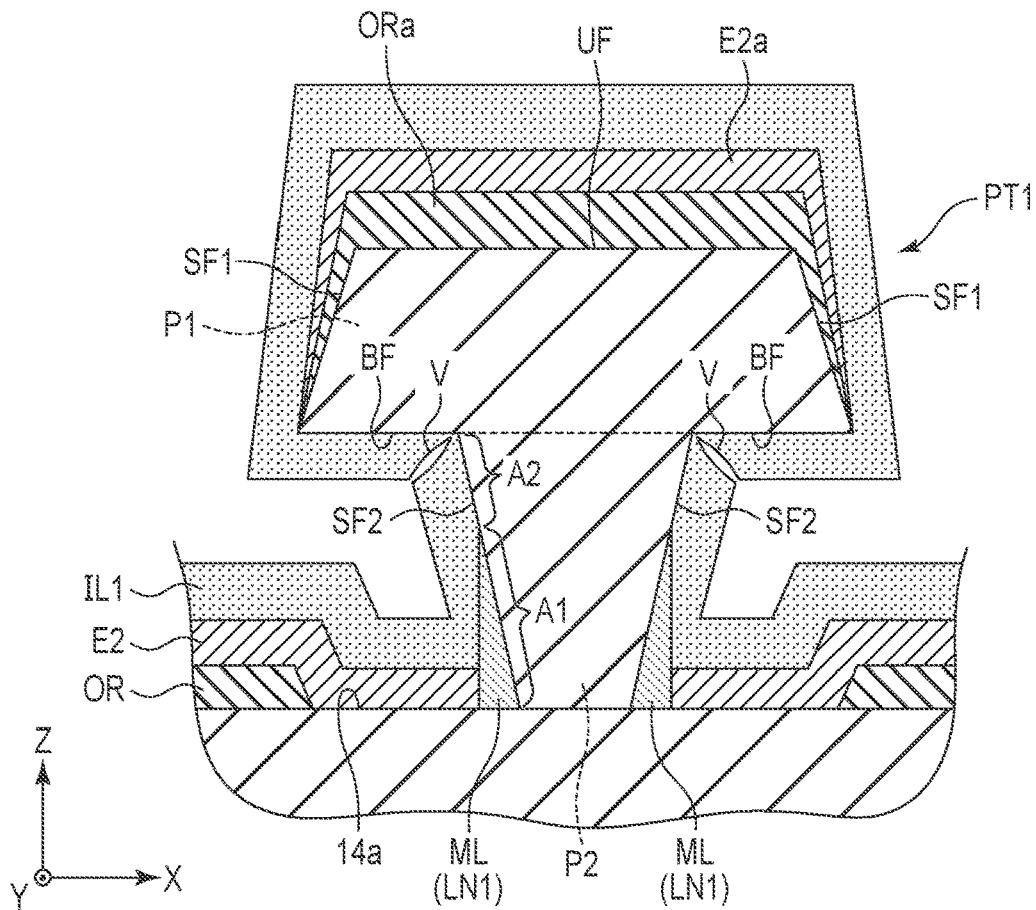
FIG. 13 is a cross-sectional view illustrating advantages of the embodiment.

FIG. 13 is an enlarged cross-sectional view schematically showing the vicinity of the partition wall PT1. After the second electrode E2 is formed, the first inorganic layer IL1 is formed by, for example, vapor deposition such as the chemical vapor deposition (CVD). When the first inorganic layer IL1 is formed by the vapor deposition, the inorganic layer grows from one surface and also grows from the other surface, in the vicinity of a corner composed of two surfaces that form a large angle. When these inorganic layers approach each other, the inflow of gas into the area between them is suppressed, and crevasse-like voids (gaps) and the seams may be formed. Since it is difficult for the resin layer RL to enter the voids, the air can remain in the voids.

In the example shown in FIG. 13, voids V are formed near the corners of the side surfaces SF2 and the lower surfaces BF. The seams may be formed near the corners of the side surfaces SF2 and the lower surfaces BF, instead of the voids V. If the voids V and the seams are formed, impregnation of the moisture into the display device 20 cannot be sufficiently suppressed.

In other words, if the metal layer ML is formed on the entire side surfaces SF2, the moisture that has entered the inside of the first inorganic layer IL1 through the voids and seams can reach the display element 20 along the boundary between the metal layer ML and the side surfaces SF2 and the boundary between the metal layer ML and the first inorganic layer IL1. When the moisture reaches the display element 20, especially the organic layer OR, this can a reason for the display failure such as a decrease in luminance of the display element 20 (generation of dark spots).

In contrast, in the present embodiment, the first area A1 of the side surfaces SF2 is covered with the metal layer ML, and the second area A2 above the first area A1 is covered with the first inorganic layer IL1. In this configuration, the first inorganic layer IL1 and the side surface SF2 are brought into contact with each other at a position between the voids V or seams and the metal layer ML, and the path of impregnation of the moisture into the metal layer ML and the display element 20 can be blocked. As a result, the display quality of the display device DSP can be improved.

Furthermore, since the first inorganic layer IL1 and the partition wall PT1 are formed of the inorganic material, desirable adherence between the first inorganic layer IL1 and the side walls SF2 is achieved. As a result, impregnation of the moisture into the metal layer ML and the display element 20 can be more appropriately suppressed. The sectional structure including the partition wall PT1 and the first linear portions LN1 are shown in FIG. 13, but the same advantage can also be obtained in the sectional structure including the partition wall PT2 and the second linear portions LN2.

When the metal layer ML is used as a power supply line FL to the second electrode E2 as described above, the other power supply line FL does not need to be formed. In this case, if the metal layer ML is shaped to surround the display element 20 as shown in FIG. 6, power can be efficiently supplied from the surrounding of the second electrode E2.

The configuration in which the metal layer ML and the second electrode E2 are in contact with each other is shown in FIG. 5 and FIG. 7 but, when the metal layer ML is not used as the power supply line FL, the second electrode E2 and the metal layer ML may be separated from each other.

All of the display devices that can be implemented by a person of ordinary skill in the art through arbitrary design changes to the display devices described above as embodiments of the present invention come within the scope of the present invention as long as they are in keeping with the spirit of the present invention.

Various types of the modified examples are easily conceivable within the category of the ideas of the present invention by a person of ordinary skill in the art and the modified examples are also considered to fall within the scope of the present invention. For example, additions, deletions or changes in design of the constituent elements or additions, omissions, or changes in condition of the processes arbitrarily conducted by a person of ordinary skill in the art, in the above embodiments, fall within the scope of the present invention as long as they are in keeping with the spirit of the present invention.

In addition, the other advantages of the aspects described in the embodiments, which are obvious from the descriptions of the present specification or which can be arbitrarily conceived by a person of ordinary skill in the art, are considered to be achievable by the present invention as a matter of course.

What is claimed is:

1. A display device comprising:
a substrate;
a plurality of display elements disposed above the substrate, each of the display elements comprising a first electrode, a second electrode opposed to the first electrode, and a first organic layer emitting light by applying a voltage between the first electrode and the second electrode;
a partition wall located between the display elements adjacent to each other;
a metal layer along the partition wall;
an inorganic layer formed of an inorganic material to cover the display elements, the partition wall, and the metal layer;
a conductive layer above the partition wall; and
a second organic layer above the partition wall,
wherein
the partition wall includes a first portion, and a second portion which is located below the first portion and which is smaller in width than the first portion,
the first portion has a first side surface and a lower surface connected to the first side surface,
the second portion has a second side surface connected to the lower surface,
an end portion of the first portion protrudes from the second side surface,
the conductive layer is disposed above the first portion,
the second organic layer is disposed between the conductive layer and the first portion,
the first organic layer and the second organic layer are not formed on the lower surface, the second side surface, and an area below the end portion of the first portion,
the second electrode and the conductive layer are not formed on the lower surface,
the metal layer covers a first area on the second side surface of the second portion,
the inorganic layer covers a second area on the second side surface,
the second area is located between the first area and the first portion,
the second electrode is in contact with the metal layer below the end portion of the first portion, and
the inorganic layer covers the second electrode, the metal layer, the first side surface, the second side surface, the lower surface and the conductive layer.

2. The display device of claim 1, wherein
the partition wall is formed of an inorganic material.

3. The display device of claim 1, further comprising:
a rib located between the display elements adjacent to each other,
wherein
the partition wall and the metal layer are disposed on the rib.

4. The display device of claim 3, wherein
the partition wall is disposed in a grating shape, and
a part of the metal later is located between the second portion and the rib, at an intersection of the partition wall.

5. The display device of claim 1, wherein
the metal layer surrounds at least one of the display elements.

6. The display device of claim 1, wherein
the first side surface includes a pair of first side surfaces, and
the pair of first side surfaces are inclined such that a distance between the first side surfaces increases from an upper end to a lower end of the first portion.

7. The display device of claim 6, wherein
the second side surface includes a pair of second side surfaces, and
the pair of second side surfaces are inclined such that a distance between the second side surfaces decreases from an upper end to a lower end of the second portion.

8. The display device of claim 7, further comprising:
a rib located between the display elements adjacent to each other,
wherein
the partition wall and the metal layer are disposed on the rib,
the lower surface includes a pair of lower surfaces connecting the pair of first side surfaces with the pair of second side surfaces, and
the pair of lower surfaces are opposed to an upper surface of the rib.

9. The display device of claim 8, wherein
the inorganic layer covers the pair of lower surfaces.

10. The display device of claim 8, wherein
the metal layer is in contact with the upper surface of the rib.

11. The display device of claim 8, wherein
an upper end of the metal layer is located above the second electrode on the rib.

12. The display device of claim 8, wherein
an end portion of the first organic layer is located on the upper surface of the rib and covered with the second electrode.

13. The display device of claim 8, wherein
a width of the metal layer is smaller than a width of the lower surface.

14. The display device of claim 13, wherein
the width of the metal layer is smaller than a height of the metal layer.

15. The display device of claim 1, wherein
the first area is larger than the second area.

16. The display device of claim 1, wherein
the second side surface includes a pair of second side surfaces,
the metal layer includes a pair of linear portions that are in contact with the pair of second side surfaces, respectively, and a connection portion connecting the pair of linear portions, and
the connection portion is located below the second portion.

* * * * *